(12) United States Patent
Chou et al.

(10) Patent No.: US 6,751,517 B1
(45) Date of Patent: Jun. 15, 2004

(54) METHOD AND APPARATUS FOR PREVENTING CONTAMINATION DURING A PROCESS FLOW

(75) Inventors: Wen-Hai Chou, Hsinchu Hsien (TW); William Wei-Yi Kuo, Kaohsiung (TW); MingLiu Peng, Hsinchu Hsien (TW); Wen-Hsi Lin, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 718 days.

(21) Appl. No.: 09/642,500

(22) Filed: Aug. 18, 2000

(30) Foreign Application Priority Data

Oct. 8, 1999 (TW) .................................... 88117403 A

(51) Int. Cl.[7] ............................................ G06F 19/00
(52) U.S. Cl. .......................... 700/121; 700/104; 438/5
(58) Field of Search ................................ 700/121, 119, 700/97, 100, 103, 104, 110, 120, 117; 438/584, 649, 5–13

(56) References Cited

U.S. PATENT DOCUMENTS

| | | | | | |
|---|---|---|---|---|---|
| 4,923,562 A | * | 5/1990 | Jucha et al. | ................... | 216/67 |
| 5,654,588 A | * | 8/1997 | Dasse et al. | ................. | 257/754 |
| 5,694,325 A | * | 12/1997 | Fukuda et al. | ............... | 700/121 |
| 5,831,865 A | * | 11/1998 | Berezin et al. | ................ | 716/7 |
| 6,148,239 A | * | 11/2000 | Funk et al. | ..................... | 700/1 |
| 6,291,252 B1 | * | 9/2001 | Yu et al. | ......................... | 438/5 |
| 6,444,569 B2 | * | 9/2002 | Farkas et al. | ............... | 438/633 |
| 6,516,237 B1 | * | 2/2003 | Aoki et al. | .................... | 700/95 |

OTHER PUBLICATIONS

Funakoshi et al. "A Rule–Based VLSI Process Flow Validation System With Macroscopic Process Simulation", IEEE, vol. 3, No. 4 Nov. 1990, pp. 239–246.*

* cited by examiner

Primary Examiner—Leo Picard
Assistant Examiner—Chad Rapp
(74) Attorney, Agent, or Firm—Thomas, Kayden, Horstemeyer & Risley

(57) ABSTRACT

A method and apparatus for finding contamination occurrence and for preventing the propagation of the contamination is provided according to the present invention, which altogether constitutes a contamination prevention system. The present invention employs a computer for examining a process flow in order to find out whether a process step is contaminated by using a contaminated tool and therewith to show a proper representation on a process flow. Any process flow that passes the contamination prevention system of the present invention can be free of any contamination problem. Furthermore, The contamination prevention system according to the present invention gives a tag for each object. If an object is tagged "contaminated", then the system forbids the next process step, that includes uncontaminated tools, to be executed. The present invention can be built to an automatic system to prevent the propagation of contamination from occurring.

22 Claims, 4 Drawing Sheets

METHOD AND APPARATUS FOR PREVENTING CONTAMINATION DURING A PROCESS FLOW

BACKGROUND OF THE INVENTION

1. Field of the Invention

The present invention generally relates to a method and apparatus for preventing contamination during a process flow.

2. Description of the Related Art

For mass-production consideration, the sequence of equipment used in a process flow must be well kept in order to avoid cross-contamination. For example, in a process flow for semiconductor wafers, an etch equipment used for patterning a metal layer can not be used to pattern a polysilicon layer during the same process flow. It is because that metals, typically Al or Cu, can induce localized energy states in the forbidden energy gap of the gate oxide to increase the gate leakage and therefore degrade the device performance. If a wafer A having a metal layer and a wafer B not having a metal layer are both processed in the same equipment, it is possible for the wafer B to acquire some metal atoms undesirably from the wafer A. Since the wafer B may contribute the metal atoms directly to equipment during the subsequent steps of the process flow, other wafers not having the metal layers are also at the risk of being contaminated by the metal atoms.

Although the process flows in many semiconductor manufacturing factories today are performed and monitored by automatic computer-controlled systems, such as a manufacture executive system (MES), the typical methods employed to prevent wafer contamination are still manually performed. For example, when a well-trained operator receives a cassette containing a plurality of wafers, he (or she) has to check out whether or not a special mark or tag indicating the presence of metal is thereon attached to the cassette in order to process the cassette with a proper action. If by any chance the operator omits the step to check the mark or label on the surface of the cassette and process it directly, a disaster of a wide-spread contamination among the processed wafers may occur.

SUMMARY OF THE INVENTION

Therefore, an object of the present invention is to provide a method and apparatus for preventing contamination automatically during a process flow.

In accordance with one aspect of the present invention, a method is provided as follows for finding contamination occurrence in a process flow according to the present invention. First of all, a tool database in which a plurality of tools are defined of "tagged" by a set of contamination information of the tool database for being either a contaminated tool or an uncontaminated tool. Then a process database including the order of steps in the relevant process flow and a corresponding tool information for each step of the process is input to the computer. Said tool information includes at least one tool to be executed during the relevant step of the process flow without including the contamination information of each tool. Finally, the process database associated with the tool database is cross-examined in order to display a contamination warning message prior to the occurrence of contamination in one of the steps of a relevant process flow, which is in the danger of the process flow is already contaminated.

In accordance with another aspect of the present invention, an apparatus is provided for finding contamination occurrence in a process flow. Said apparatus comprises at least a memory device and a processor connected to the memory device, wherein a program is stored in the memory device for controlling the processor. Said processor operates according to the program of the memory device to input a tool database in which a plurality of tools are defined or "tagged" by a set of contamination information of the tool database for being either a contaminated tool or an uncontaminated tool. Then a process database including the order of steps in the relevant process flow and a corresponding tool information for each step of the process flow is input to the computer. Said tool information includes at least one tool to be executed during the relevant step of the process flow without including the contamination information of each tool. Finally, the process database associated with the tool database is cross-examined in order to display a contamination warning message prior to the occurrence of contamination in one of the steps of a relevant process flow, which is in the danger of being contaminated if any one of the preceding steps of the process flow is already contaminated.

The major advantage of the above-mentioned method and apparatus according to the present invention is that possible occurrence of contamination in a process flow can be detected and warned well before the actual implementation of the process flow by an automatic system.

In accordance with yet another aspect of the present invention, a contamination prevention system is provided for finding contamination occurrence in a process flow. Said system comprises at least a memory device and a processor. The memory device has a tool database in which a plurality of tools for manufacturing an object are defined. The memory device further includes a process database comprising a plurality of steps in a relevant process flow and a set of object specific information. In particular, the tool database includes a contamination information for each tool to determine whether the relevant tool is a contaminated tool or an uncontaminated tool. The process database comprises a set of tool information for each step of the process flow. The tool information includes at least one tool to be executed during the relevant step of the process flow. The object information includes a contamination tag to indicate whether the object is contaminated or uncontaminated. The processor communicates with the memory device and is configured to initiate a contamination tag to indicate that the object is uncontaminated before the object is sent to experience any process step. If, the object has experienced any process step whose tool information includes at least a contaminated tool, the contamination tag of the object would indicate that the object is contaminated. On the contrary, if the tool information of a succeeding process step indicates an uncontaminated tool and a contaminated object, the object is prohibited from being executed by said process step.

The major advantage of the above method is to prevent a widespread occurrence of contamination during a process of fabricating an object by an automatic system.

Further features and advantages of the present invention, as well as the structure and operation of various embodiments of the present invention, are described in detail below with respect to the accompanying drawings.

In the drawings, like reference numbers indicate identical or functionally similar elements.

DETAILED DESCRIPTION OF THE PREFERRED EMBODIMENTS

The present invention provides a method and apparatus for finding contamination occurrence in a process flow before the process flow is set up in an automatic manufacturing system. According to a preferred embodiment of the present invention, the present invention is contrived to have its applications found in a semiconductor factory.

Figure 1:
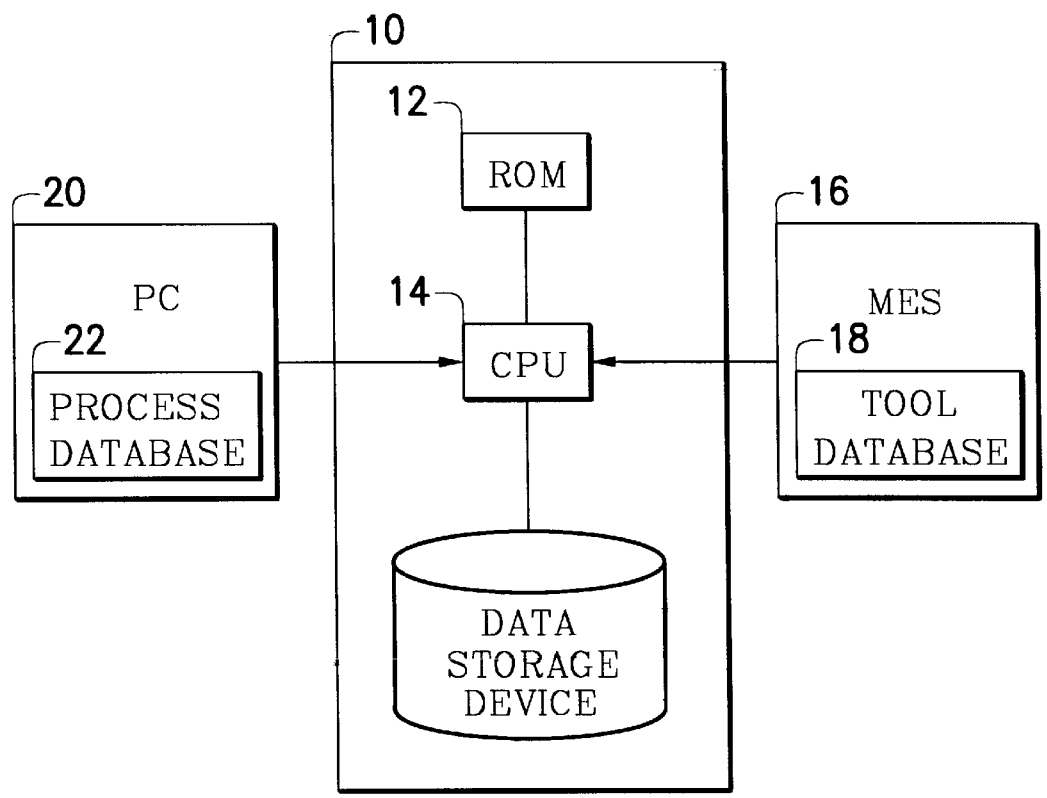
FIG. 1 is a schematic diagram representing a first embodiment of the present invention.

Referring to FIG. 1, FIG. 1 is a schematic diagram representing a first embodiment of the present invention. The apparatus 10 according to the present invention for finding contamination occurrence in a process flow comprises a memory device, such as the ROM 12, and a processor, such as the CPU 14, connected to the memory device. ROM 12 stores a program for controlling the CPU 14.

On the other hand, a manufacture executive system (MES) 16 according to the present invention can handle each operation and relevant status of the tools, such as etch machine, furnace, stepper etc., used in a semiconductor factory. For example, MES 16 defines which tool is on working or on periodical maintenance, allowing wafers carried in a cassette to be processed by a tool, and decides the subsequent process that a cassette is subject to. MES 16 also stored a tool database 18 including a contamination information for each tool. Such a contamination information defining the pertaining tool is a post-metal (contaminated) tool, a pre-metal (uncontaminated) tool or a general (non-contamination-specific) tool. The process flows in a semiconductor factory can have process steps for forming such metal layers as Titanium layers, Copper layers, Alumni layers, etc. These metal layers are sources of contamination sources as well known in the art. The tools dedicated to process the wafers without metal layers, for instance, gate oxidation furnaces, are pre-metal tools, which should never be contaminated. Some other tools dedicated to process the wafers with metal layers, for instance, metal etchers, are post-metal tools where metal is allowed in these tools. Other tools not concerning the metal problem that never induce cross-contamination, such as photo steppers, are general tools.

Process integration engineers (PIE) or technology development engineers (TD) are usually the sources for providing a process database 22, wherein the engineers design a process flow in the hope of building up the process flow in MES 16 to control the processes as required. The process database 22 represents a plurality of sequences of process steps associated with the process flow. The process database 22 also includes a set of tool information for each process step. Furthermore, a tool information includes at least one tool to execute the relevant process step and to exclude the contamination information of each tool. The process database also includes a recipe information for each process step.

Figure 2:
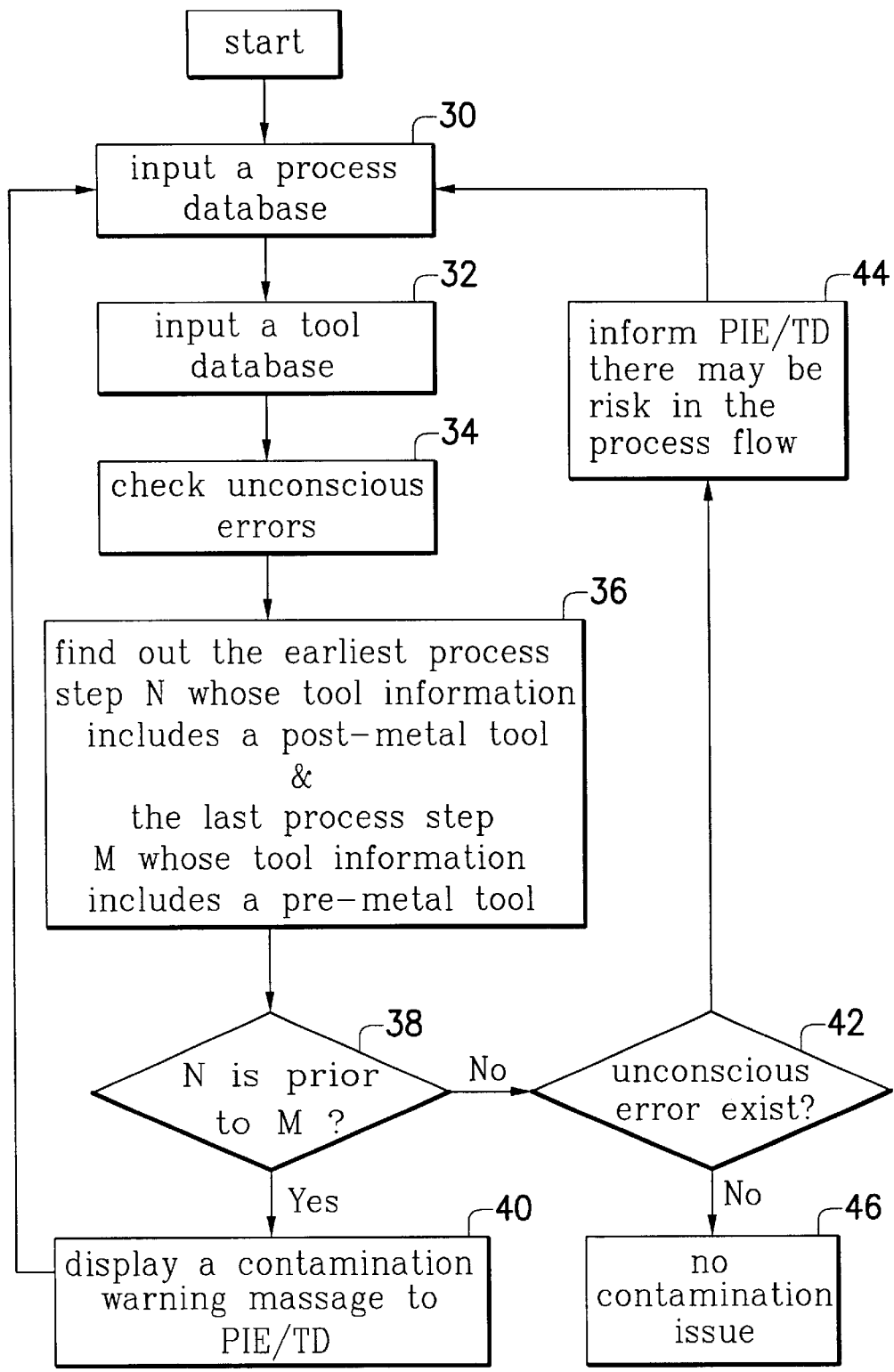
FIG. 2 is a block diagram depicting the process flow of one embodiment of the program stored in the ROM shown in FIG. 1.

Referring to FIG. 2, FIG. 2 is a block diagram depicting the process flow of one embodiment of the program stored in the ROM shown in FIG. 1. CPU 14 operates according to the program in ROM 12. At first, the process database 22 provided by the PIE/TD is input via a soft disk, a cable, a network, etc. and then stored in a data memory device 30. The tool database 18 being stored in EMS 16 is input via a network and then stored in the data memory device 32. IN addition, basic data formation of the process database is checked to find out if any unconscious errors 34, such as an empty column, exist in the process database since the process flow is a draft from PIE/TD. Then, the process database is examined in associated with the tool database to find out the earliest process step N with a set of tool information that includes a post-metal tool and the last process step M with a set of tool information that includes a pre-metal tool 36. If the process step N is executed prior to the process step M, a contamination warning message will be displayed to inform the PIE/TD that the process database contains the risk of being contaminated as soon as it is executed by the MES 40. The PIE/TD must redraft the process database to reexperience the apparatus according to the invention. If the process step M is executed prior to the process step N, the tools listed in the process database can be free from contamination. However, if some unconscious errors have been found in the process database 42, the PIE/TD should be able to correct these unconscious errors in order to prevent faulty process step from occurring during the process flow 44. Each time the process database is modified by the PIE/TD, the modified process database is preferably implemented to the apparatus to prevent contamination from occurring. If there are neither contamination issue nor unconscious error existed in the process flow, the process flow then can be build in the MES 46.

The major advantage of the first embodiment is providing a preventive contamination check before the process flow is actually set in the MES. If all wafers processed in a semiconductor factory are processed by process flows according to the present invention, contamination can be prevented before occurring.

Figure 3:
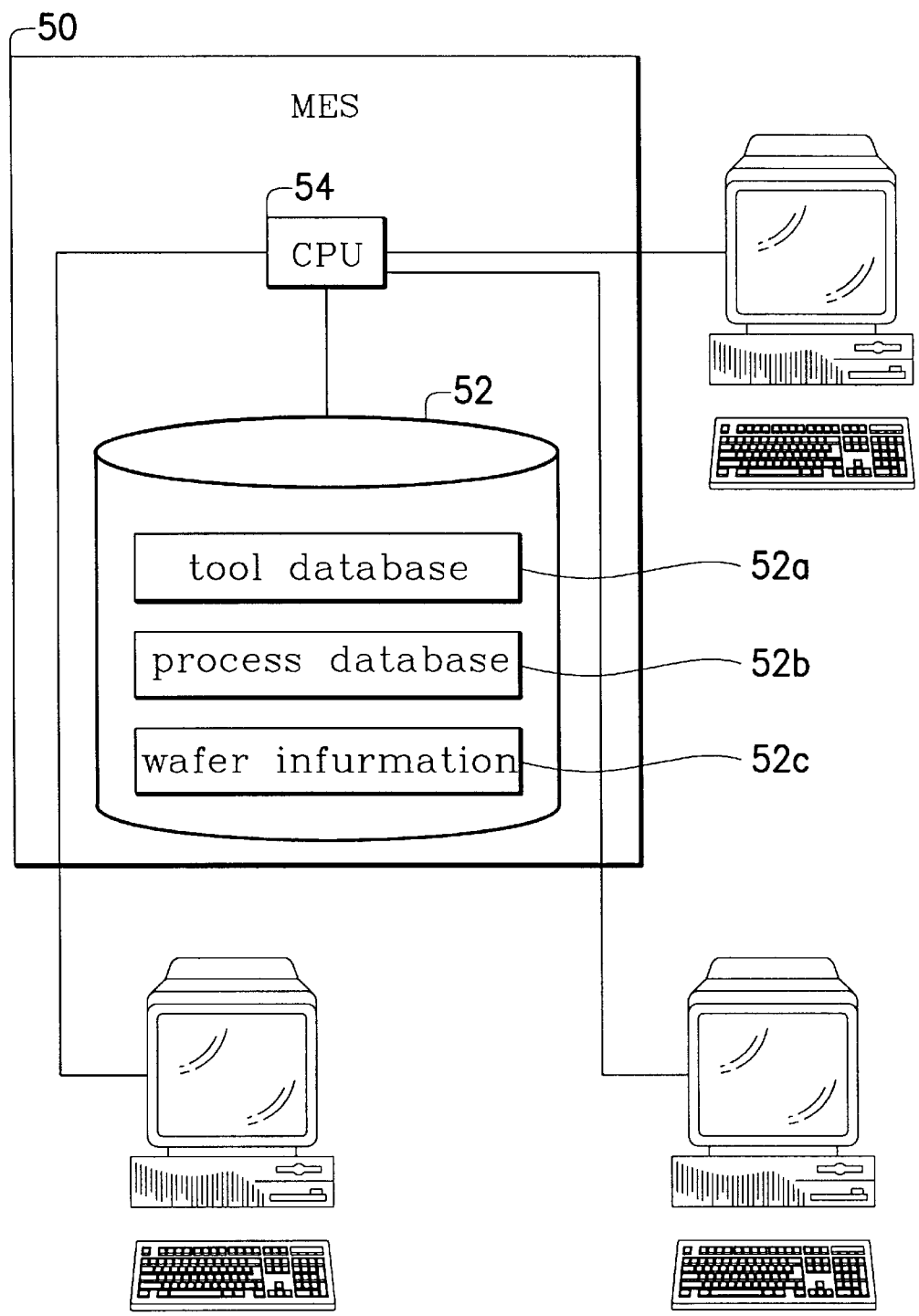
FIG. 3 is a schematic diagram representing a second embodiment of the present invention.

The present invention further provides a method and system for preventing contamination from occurring during the manufacture of a semiconductor wafer since, after the process flow is set in the MES, engineers may occasionally change the process flow for various special reasons and may cause an unexpected contamination. Referring to FIG. 3, FIG. 3 is a schematic diagram representing a second embodiment of the present invention. According to this preferred embodiment, the present invention described hereinafter is applied to an MES 50 comprising a memory device 52 and a processor 54 for controlling process steps executable in order by a relevant tool.

The memory device stores a tool database, a process database, and wafer information. The tool database 52a represents the tools for manufacturing the wafer and includes a set of corresponding contamination information for each tool to indicate whether the pertaining tool is a contaminated tool or an uncontaminated tool. The process database 52b represents a plurality of process steps that includes a tool information for each process step. The tool information includes at least one tool to be executed in the relevant process step. The wafer information represents the relevant wafer that includes a contamination tag for indicating whether the wafer is contaminated or uncontaminated.

The processor 54 communicating with the memory device 52 is configured to have the following features. First of all, the processor 54 initiates a contamination tag to indicate whether the wafer is clean before the wafer experiences any process step. For example, as a wafer or a cassette is to be processed in a semiconductor factory, operator(s) must create a set of wafer information relevant to the wafer in the MES with the default of the contamination tag being clear.

Figure 4:
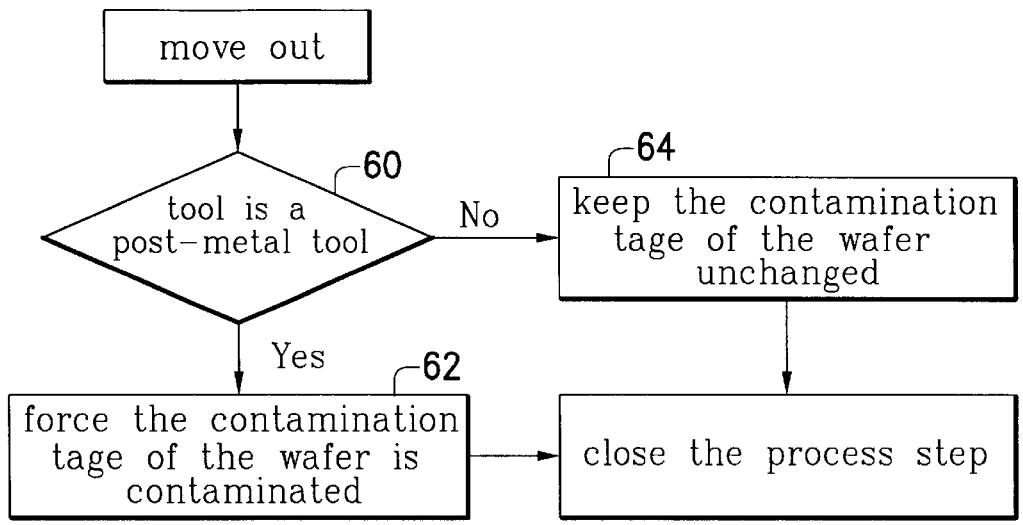
FIG. 4 is a block diagram depicting the process flow of one embodiment of the program stored when a "move-out" is initiated.

Secondly, after the wafer experiences a process step in which the relevant tool information includes at least a contaminated tool, the processor forces the contamination tag of the wafer to indicate a status of contamination. For example, when a trained operator wants to begin a process for a wafer, the operator has to key "move-in" into the MES via an operator interface or an equipment application, moves the wafer with a certain tool handled by the operator, and starts the recipe shown by the MES. After the tool finished the process, the trained operator then has to key "move-out" into the MES via an operator interface or an equipment application. Referring to FIG. 4, FIG. 4 is a block diagram depicting the process flow of one embodiment of the program when "move-out" is initiated. At this moment, if the certain tool is a post-metal tool 60, the MES according to the present invention forces the contamination tag of the wafer to indicate whether the wafer is contaminated as represented by step 62. Otherwise, the contamination tag of the wafer is kept unchanged as represented by step 64.

Figure 5:
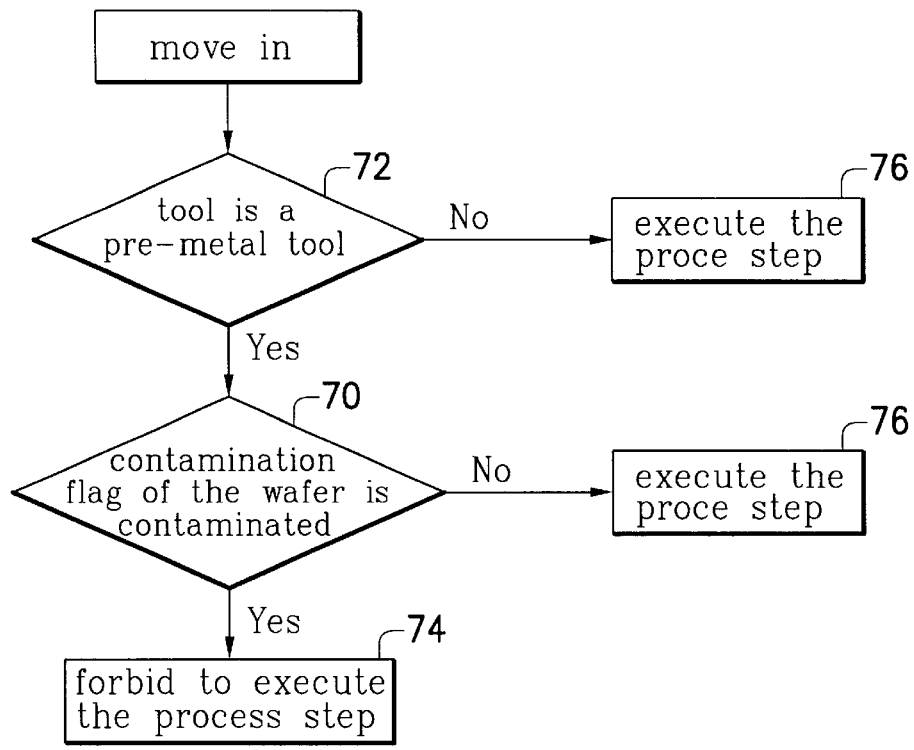
FIG. 5 is a block diagram depicting the process flow of one embodiment of the program stored when a "move-in" is initiated.

Thirdly, if the tool information of a next process step includes the status of an uncontaminated tool and a contaminated wafer, the processor forbids the wafer from being executed by the next process step. Referring to FIG. 5 FIG. 5 is a block diagram depicting the process flow of one embodiment of the program when "move-in" is initiated. For example, as soon as the trained operator keys "move-in" into the MES<the MES according to the present invention begins to check the contamination tag of the wafer and the contamination information of the relevant tool. If the contamination tag of the wafer shows that the wafer is contaminated 70 and the contamination information of the relevant tool shows that the tool is a pre-metal tool 72, it means that processing the wafer by the relevant tool will cause a contamination not allowed. MES will either show a message to the trained operator or step the relevant tool immediately in order to stop the processing as represented by the step 74. Otherwise, the MES allows the proceeding of the process step to continue, and the operator can thereafter move the wafer to the next step 76.

In contrast to the manual method for preventing contamination, the present invention provides a method and apparatus to find out possible occurrence of contamination in a process flow before the process flow is built in the MES. Furthermore, a system is provided to forbid the contaminated wafer from being processed in a pre-metal tool. All the activities of the present invention can be automatically executed by computer(s) with proper programming to keep those pre-metal tools away from unpredicable contaminated source(s).

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for finding contamination occurrence in a process flow, comprising the following steps:

inputting, through a network, a tool database representative of tools, the tool database including a set of contamination information for each tool to define that the pertaining tool is a contaminated tool or an uncontaminated tool;

inputting, using a computer, a process database including the order of steps in the process flow, the process database having a tool information for each step, the tool information including at least one tool to be executed during the relevant step of the process flow without including the contamination information of each tool; and cross-examining, using a computer, the process database associated with the tool database to display a contamination warning message if one of the steps executed by a contaminated tool is executed prior to one of the steps executed by an uncontaminated tool in the process flow.

2. The method of claim 1, wherein the process flow is devoted to a manufacturing of semiconductor wafers.

3. The method of claim 1, wherein the contaminated tool is a post-metal tool and the uncontaminated tool is a pre-metal tool.

4. The method of claim 1, wherein the process flow include a process step of forming titanium.

5. The method of claim 1, wherein the process flow include a process step of forming alumni.

6. The method of claim 1, wherein the process flow include a process step of forming copper.

7. The method of claim 1, wherein the contamination information for each tool represent that the pertaining tool is a contamination-nonsensitive tool, a contaminated tool or an uncontaminated tool.

8. The method of claim 1, wherein the tool database is stored in a manufacture executive system.

9. A system for preventing from contamination during manufacturing a object, comprising:

a memory device having a tool database representative of tools for manufacturing the object, a process database representative the order of steps, and an object information representative of the object, wherein the tool database including a set of contamination information for each tool to define that the pertaining tool is a contaminated tool or an uncontaminated tool, wherein the process database having a tool information for each step, the tool information including at least one tool to execute the pertaining process step, the object information including a contamination tag to represent the object is clean or contaminated;

a processor in communication with the memory device, in which the processor is configured to:

initialize the contamination tag to represent the object is clean before the object experiencing any step;

force, after the object experiencing any step whose tool information includes at least a contaminated tool, the contamination tag of the object to represent the object is contaminated; and forbid, if the tool information of a next step includes an uncontaminated tool and the object is contaminated, the object to be executed by the next process step.

10. The system of claim 9, wherein the object is a semiconductor wafer.

11. The system of claim 9, wherein the object is contaminated by metal.

12. The system of claim 9, wherein the contaminated tool is a post-metal tool and the uncontaminated tool is a pre-metal tool.

13. The system of claim 9, wherein the contamination information for each tool represent that the pertaining tool is a contamination-nonsensitive tool, a contaminated tool or an uncontaminated tool.

14. The system of claim 9, wherein the forcing the contamination tag of the object to represent the object is contaminated is executed through an operator interface or an equipment application.

15. The system of claim 9, wherein the tools has etch tools, lithography tools, oxidation tools and cleaning tools.

16. An apparatus for finding contamination occurrence in a process flow, comprising:

a memory device; and a processor connected to the memory device, the memory device storing a program for controlling the processor; and the processor operative with the program to input a tool database representative of tools, the tool database including a contamination information for each tool to represent that the pertaining tool is a contaminated tool or an uncontaminated tool;

input a process database representative of sequential steps associated with the process flow, the process database having a tool information for each process step, the tool information including at least one tool to execute the pertaining process step and excluding the contamination information of each tool; and examine the process database associated with the tool database and display a contamination warning message if one of the process steps executed by a contaminated tool is executed prior to one of the process steps executed by an uncontaminated tool in the process flow.

17. The apparatus of claim 16, wherein the process flow is devoted to a manufacturing of semiconductor wafers.

18. The apparatus of claim 16, wherein the process flow include a process step of forming titanium.

19. The apparatus of claim 16, wherein the process flow include a process step of forming alumni.

20. The apparatus of claim 16, wherein the process flow include a process step of forming copper.

21. The apparatus of claim 16, wherein the contamination information for each tool represent that the pertaining tool is a contamination nonsensitive tool, a contaminated tool or an uncontaminated tool.

22. The apparatus of claim 16, wherein the tool database is stored in a manufacture executive system.

* * * * *